United States Patent [19]

Seidel

[11] 4,040,728
[45] Aug. 9, 1977

[54] ORDERED ARRAY OF INTEGRATED CIRCUIT SEMICONDUCTOR CHARGE TRANSFER DEVICE FEEDBACK DELAY TYPE OF STABILIZED PHASE-LOCKED RECURSIVE OSCILLATORS

[75] Inventor: Harold Seidel, Warren, N.J.

[73] Assignee: Bell Telephone Laboratories, Incorporated, Murray Hill, N.J.

[21] Appl. No.: 708,938

[22] Filed: July 27, 1976

[51] Int. Cl.$^2$ ............................................. H03B 9/12
[52] U.S. Cl. .................................... 331/55; 307/295; 331/56; 331/108 C
[58] Field of Search ................. 331/55, 52, 56, 108 C, 331/108 D, 108 B; 307/295

[56] References Cited

U.S. PATENT DOCUMENTS

| 1,476,721 | 12/1923 | Martin | 325/419 |
|---|---|---|---|
| 2,843,746 | 7/1958 | Hofker | 331/183 |
| 3,740,591 | 6/1973 | Butler et al. | 307/295 |
| 3,824,413 | 7/1974 | Awipi et al. | 307/295 |

OTHER PUBLICATIONS

Charge Transfer Devices, (1975), pp. 209-216, C. H. Sequin, M. F. Tompsett.
Transmission Systems for Communications, pp. 124-139, (Fourth Edition, 1970).
IEEE Transactions on Communications, vol. Com—22, No. 7, July 1974, pp. 921-925, D. A. Smith et al.
Bell Laboratories Record, vol. 44, pp. 236-238, (1966).

*Primary Examiner*—John Kominski
*Attorney, Agent, or Firm*—D. Caplan

[57] ABSTRACT

An ordered array of semiconductor integrated circuit feedback delay type of phase-locked recursive oscillators is arranged to furnish a correspondingly ordered discrete spectrum of mutually different resonant frequencies. The individual feedback path in each of the oscillators contains a semiconductor charge transfer device for providing most of the feedback delay. The total feedback delay in each of the oscillators is fine-tuned in the feedback path of each oscillator by a different incremental time delay element, such as an RC time delay element, which introduces an added delay that is less than that of a single transfer cycle in the charge transfer device. A phase-locking signal is fed to every oscillator, all the locking signals being derived from, and thus coherent with, a single master clock. All of the charge transfer devices are driven by a single clock pulse train whose timing can also be advantageously controlled by the master clock. Such an array of oscillators can be integrated in a single semiconductor chip, for use in a channel bank filter operating on heterodyne principles, for example.

16 Claims, 5 Drawing Figures

ORDERED ARRAY OF INTEGRATED CIRCUIT SEMICONDUCTOR CHARGE TRANSFER DEVICE FEEDBACK DELAY TYPE OF STABILIZED PHASE-LOCKED RECURSIVE OSCILLATORS

FIELD OF THE INVENTION

This invention relates to the field of semiconductor apparatus, and more particularly to integrated circuit semiconductor oscillators.

BACKGROUND OF THE INVENTION

In U.S. Pat. No. 3,824,413, issued on July 16, 1974 to M. Awipi et al., the use of a semiconductor charge transfer device as a delay line in a recursive oscillator configuration was disclosed. Such an oscillator is characterized by a continuous spectrum of possible resonant frequencies of oscillation. However, in certain technological applications, it is desirable that the resonant frequency of the oscillator be well controlled and stabilized at a single predetermined frequency. It is also desirable in such cases to have an ordered array of such oscillators which can thus provide a corresponding ordered array (discrete spectrum) of mutually different but precisely defined resonant frequencies, for use as local heterodyne oscillators.

In such technological applications as a frequency division multiplexed system for voice communications, for example, each message channel of the system is assigned a discrete segment of the transmitted frequency spectrum. The problem of crosstalk or confusion between adjacent voice communication channels can become intolerable in a channel bank filter receiver ("demultiplexer") in such a system unless the bandpass filtering used for discriminating between one channel and another is sufficiently well-controlled, pure, and sharp. One approach for obtaining a useful channel bank filter receiver involves the use of heterodyne principles, in order to reduce the carrier frequencies to a more convenient and manageable range. Each of such filters in a bank requires a "local oscillator", for heterodyning ("beating down") the channel frequencies to this more manageable range, known as the intermediate frequency (I.F.). Since the requirements of stringent control and complexity (and hence costs) of a passive bandpass filter (for a given sharpness and precision of the passband) vary inversely as $\Delta f/f_o$, where $\Delta f$ is the bandpass frequency range and $f_o$ is the center frequency of the band, the heterodyning process of "beating down" the carrier frequency of a signal wave with a local oscillator decreases the value of $f_o$ and hence relaxes the precision requirements on the bandpass filters. However, the local oscillator signal used for the heterodyning process in each channel must be well-controlled as to precision and purity of frequency as well as stability; otherwise, undesired crosstalk or confusion between channels arises. Thus, it is desirable to have an ordered array of such local oscillators, each of whose resonant frequencies is well-controlled, pure, precise, and stable. Moreover, these resonant frequencies should form an ordered array (discrete spectrum) of frequencies differing in equal steps corresponding to the (equal) frequency separations between next adjacent carrier frequency channels, typically a spectrum of frequencies in steps of 4 KHz for voice communications; and each of these local oscillators should have an output characterized by a stabilized sinusoidal frequency profile which is free from any frequency components of any of the other channels, in order to prevent undesirable crosstalk between such channels. However, the use of recursive filters operating as oscillators of the type described for example in U.S. Pat. No. 3,824,413 (issued to Awipi et al. on July 16, 1974) with purely semiconductor charge transfer device (CDT) elements in the feedback path would suffer from the problem of instability and hence crosstalk between channels.

SUMMARY OF THE INVENTION

An ordered array of electrical oscillator frequency sources is provided by an array of feedback delay type recursive oscillators, each oscillator containing a different semiconductor charge transfer device (CTD) of many stages in the oscillator feedback path and each oscillator having a phase-locking means. Generally, N is greater than 10 ($N > 10$), and preferably N is at least 20 ($N \geq 20$). Advantageously, the locking means is a single phase-locking signal which is fed to all the oscillators and which contains harmonics corresponding to (and hence suitable for locking) all desired oscillator frequencies. This phase-locking signal advantageously is derived from (and hence is coherent with) a single master clock source. Advantageously, also, this master clock provides the timing control for a single clock pulse train driving the charge transfer devices. Thereby, precise timing control for the whole system of oscillators with but a single master clock is obtained, accordingly reducing the cost of the system. Moreover, the time delay in each feedback path is advantageously tuned by means of a different added incremental time delay device (such as an RC delay element) for each of the charge transfer device delays. Each such incremental device enables interpolation between the time delay of a CTD of N stages and that of a CTD of (N+1) stages, thereby more nearly accurately providing the desired discrete equal step spectrum of natural oscillator frequencies. All of the associated time increments corresponding to various time delays are thus equal to less than that of a single transfer stage, that is, of a single cycle of the clock pulse train driving the charge transfer devices; and hence the delay of each of these time delay elements is small as compared with the corresponding CTD delays (since $n > 10$). Accordingly, the required accuracy of precision of the RC element is relaxed as compared to the case where the entire feedback delay of each oscillator would be provided by an RC element alone. On the other hand, the use of the RC elements, in order to tune the CTD delays, enables the use of a significantly lower amplitude of the locking signals for a given expected maximum equivalent frequency error inherent in the (relatively small) inaccuracies of the incremental time delay elements, thereby reducing feedthrough of unwanted harmonics of the locking signal itself. More importantly, the tuning (interpolation) provided by the RC elements reduces the maximum required capture range of the locking signal for each oscillator, i.e., reduces the maximum deviation of the natural peak response local oscillator frequency from the desired local oscillator frequency; therefore, the quality factors Q of the local oscillators can all be made larger by reason of the presence of these RC elements and still provide capture (locking) of each of the oscillators at the desired respective frequencies. Hence, undesired feedthrough in a given oscillator of unwanted signals at other frequencies (from other channels and from the other harmonics of the locking signal) as well as noise can be reduced by accordingly adjusting Q of the various oscillators to an increased value, for example, by means of accordingly reducing the feedback loop impedance characteristic of each local oscillator. Stabilization of the oscillator frequencies is obtained by operating every oscillator near saturation, using a different variable loss (variolosser) element in each feedback path, in order to maintain the oscillation amplitude at a relatively large predetermined value (near saturation) and hence at a relatively stably fixed predetermined frequency, as well as to reduce further the Q of each oscillator, thereby to reject undesired feedthrough of unwanted frequencies. This array of oscillators advantageously is integrated in a single semiconductror chip and can be used, for example, in a channel bank filter apparatus, characterized by consequently relaxed requirements on the parameters of the required bandpass filters.

BRIEF DESCRIPTION OF THE DRAWING

This invention, together with its features, objects and advantages, can be understood from the following detailed description when read in conjunction with the drawings in which.

DETAILED DESCRIPTION

Figure 1:
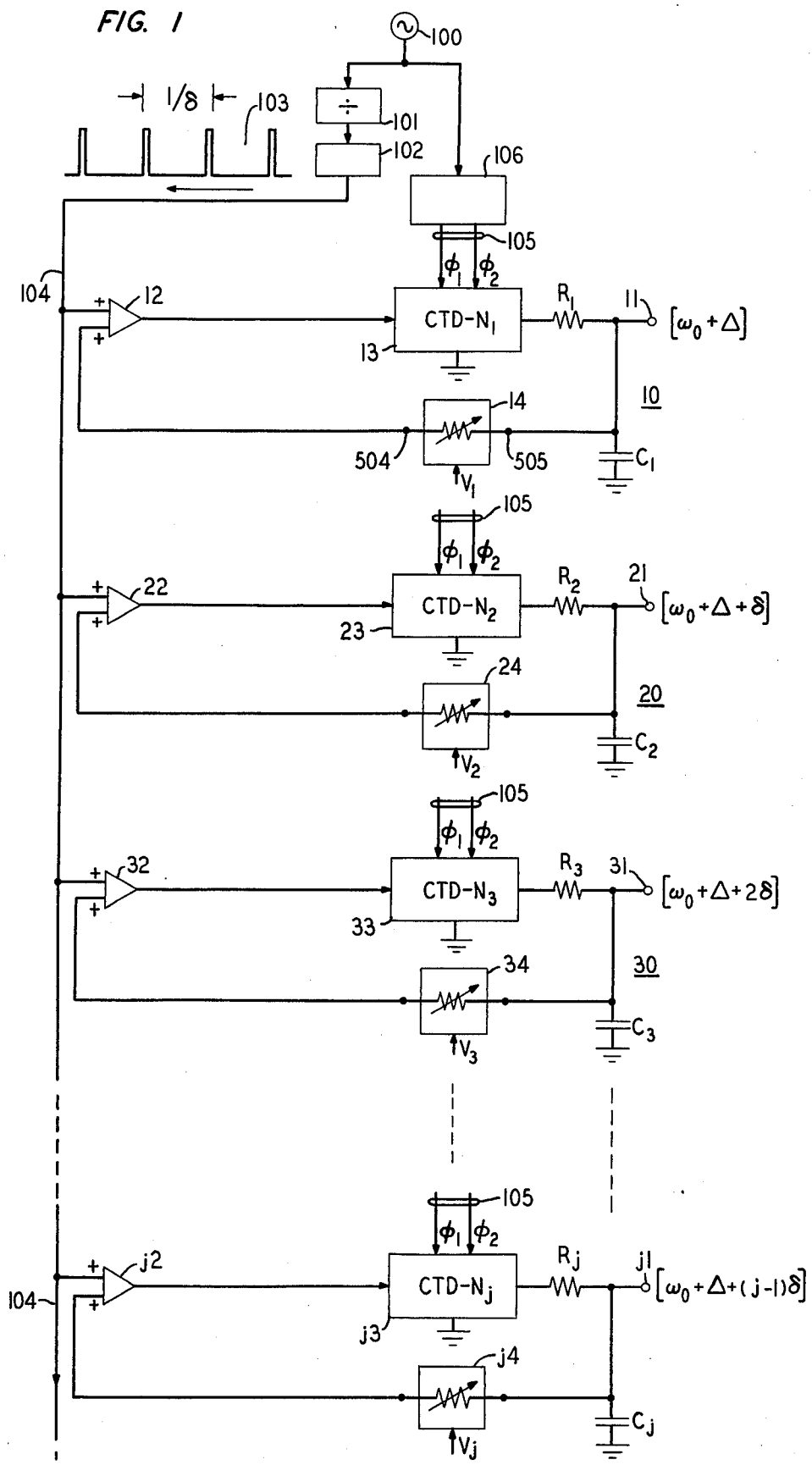
FIG. 1 is a circuit diagram of an integrated semiconductor circuit array of phase-locked recursive oscillators in accordance with a specific embodiment of the invention.
Figure 5:
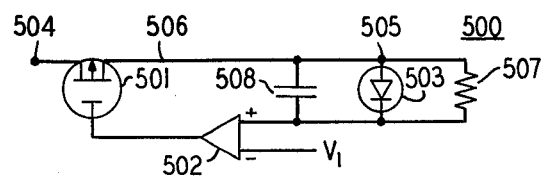
FIG. 5 is a circuit diagram of an example of a variolosser that is useful in the recursive oscillator circuits of this invention.

As shown in FIG. 1, an array of recursive filter type oscillators 10, 20, 30, etc., has signal output terminals 11, 21, 31, etc., respectively. Each of these oscillators also includes a sum amplifier 12, 22, 32, etc., respectively (alternatively a difference amplifier), which feeds a different feedback path, one such path for each oscillator. Every feedback path includes a different semiconductor charge transfer device, respectively, 13, 23, 33, etc., acting as a delay line in the corresponding feedback path. Every feedback path (or "loop") also includes (with at most a few possible exceptions noted below) a different incremental time delay element $R_1C_1$, $R_2C_2$, $R_3C_3$, etc., respectively, in series with a different variolosser element 14, 24, 34, etc., respectively. The loss in each variolosser is controlled by a different applied voltage $V_1$, $V_2$, $V_3$, etc. An example of one form of a suitable variolosser is shown in FIG. 5.

Each of the amplifiers, 12, 22, 32, etc., has a pair of input terminals, one of which is fed by a different one of the feedback paths and the other of which is fed by a locking signal 103 on a locking signal line 104. The locking signal is provided by monostable multivibrator 102. This multivibrator is controlled by a frequency divider 101 in turn controlled by an output signal of a single master clock 100. Thereby, the multivibrator provides the locking signal 103 characterized by a sequence of substantially identical narrow pulses ("spikes") characterized by a periodicity of $1/\delta$, i.e., a pulse repetition rate of $\delta$. Because of the control by the master clock, these pulses of the locking signal 103 will be phase coherent with the output of the master clock 100.

Advantageously, the width of each of the pulses in the locking signal 103 is at least about two orders of magnitude less than the periodicity ($1/\delta$) of the pulses, so that among the lowest order harmonics there are at least hundreds of the lowest order harmonics all present and of roughtly equal strength (amplitude) in the locking signal.

Each of the charge transfer devices 13, 23, 33, etc., contains a different (in general, but not necessarily all different) integral number $N_1$, $N_2$, $N_3$, etc., of transfer stages and is driven by a two (or more) phase ($\Phi_1\Phi_2$) clock pulse driving train 105 supplied by a driver 106 whose cycle timing is controlled by the master clock 100. Each of the variolossers 14, 24, 34, etc., is adjusted in advance (once and for all) such that if and when the corresponding oscillator 10, 20, 30, etc., is actually in a state of desired oscillation during operation in response to the locking signal 103, then the amplitude of such oscillation is limited to a near saturation value; that is, a value such that the overall feedback loop gain (as measured at small signal operation, well below saturation) differs from unity by a relatively small amount, of the order of $10^{-2}$, advantageously of about $10^{-2}$ or less, preferably of the order of $10^{-4}$. More specifically, if an amplifier (such as 12, 22, 32) in a given feedback loop is a summing amplifier, then this loop gain should thus be slightly greater than unity; whereas if such an amplifier is a difference amplifier, then this loop gain should be slightly less than unity. This operation at near saturation accordingly aids in stabilizing the amplitude and frequency of the oscillations in each of the oscillators 10, 20, 30, etc. Thereby, the resulting output signals at terminals 11, 21, 31, etc., which are produced during operation in response to the locking signal 103, will form an ordered array of pure and stabilized predetermined sinusoidal outputs of frequencies equal to: $(\omega_o + \Delta)$, $(\omega_o + \Delta + \delta)$, $(\omega_o + \Delta + 2\delta)$, etc., where $(\omega_o + \Delta)$ is the lowest frequency desired, 400 kHz for example. More specifically, $\omega_o$ is the lowest (including carrier) signal frequency to be heterodyned in a channel bank filter receiver, for example, and $\Delta$ is the intermediate frequency ("I.F.") in the heterodyning process, as more fully described below.

As an example, by way of illustration only, the master clock 100 puts out a master control signal at $10^7$ Hz. This master signal is then divided by 2,500 by the divider 101. Thereby the divider 101 produces a control signal of frequency 4 kHz to control the multivibrator 102. In response thereto, the multivibrator 102 provides the locking signal 103 in the form of a periodic train of pulses of pulse repetition rate $\delta$ = 4 kHz ($1/\delta$ = 0.25 millisec.), and of individual pulse width advantageously equal to about ¼ microsecond or less. Thus the ratio of one period in the pulse train to the pulse width is advantageously 1,000 or more. Hence, all of the first five hundred or more harmonics of 4 kHz are present in the locking signal; that is, the locking signal contains a discrete spectrum of harmonic components including all frequencies in steps of 4 kHz from 4 kHz to 2000 kHz (2 MHz) or more, all with approximately the same amplitude. The clock pulse driving train 105 is typically two phase ($\Phi_1\Phi_2$) with a clock cycle frequency of also $10^7$ Hz as controlled by the master clock 100.

Continuing with the description of the example for purpose of illustration only, with $(\omega_o + \Delta) = 400$ kHz, the first charge transfer device 13 has the lowest number of stages in the array, namely, 25 stages ($N_1 = 25$). Thus, so long as there is no other source of significant delay in the feedback loop of the oscillator 10, there is no need for $R_1$ or $C_1$ in this peculiar case, simply because the natural oscillation frequency $(\omega_o + \Delta)$ of the first oscillator 10 is just equal to $(10^7 \div 25) = 400$ kHz, which itself happens to coincide with a useful or desirable frequency for this oscillator (without the aid of an RC delay element), since this frequency 400 kHz happens to coincide with the lowest member $(\omega_o + \Delta)$ of the desired discrete spectrum of outputs furnished by the array. The second transfer device 14 has an integral number of stages $N_2 = 24$ together with $R_2C_2 = 0.0752475$ microseconds, typically with $R_2 = 10,000$ ohms and $C_2 = 7.52475$ picofarads. Thereby, the natural frequency $(\omega_o + \Delta + \delta)$ of the second oscillator 20 is just about 404 kHz, which is just the desired 4 kHz higher than that of the first oscillator 10. The third transfer device 33 in the oscillator 30 has $N_3 = 24$ stages, with $R_3C_3 = 0.050880392$ microsec., and a natural frequency $(\omega_o + \Delta + 2\delta)$ of 408 kHz. The remaining $N_4, N_5, \ldots N_{26}$, can be similarly calculated; in particular, with $N_{26} = 20$, $R_{26}C_{26} = 0$, and $f_{26} = 500$ kHz.

It may be noted that since $N_{26} = 20$ happens to produce a natural frequency of 500 kHz, which itself coincides with a desired frequency in the desired spectrum, without the aid of any incremental RC delay element; therefore, no incremental RC should be added for this oscillator (except to correct for possible parasitics). In general, the number of oscillators that do not require an incremental RC delay element will of necessity be small in comparison with total number of oscillators in the array, and assuredly less than one-half of the total number of oscillators. Thus, in any event, when these oscillators are all fed the same locking signal 103, the corresponding harmonic of this locking signal captures each corresponding oscillator in the desired mode of oscillation to produce the desired frequency spectrum: $(\omega_o + \Delta), (\omega_o + \Delta + \delta), (\omega_o + \Delta + 2\delta)$, etc.

Figure 2:
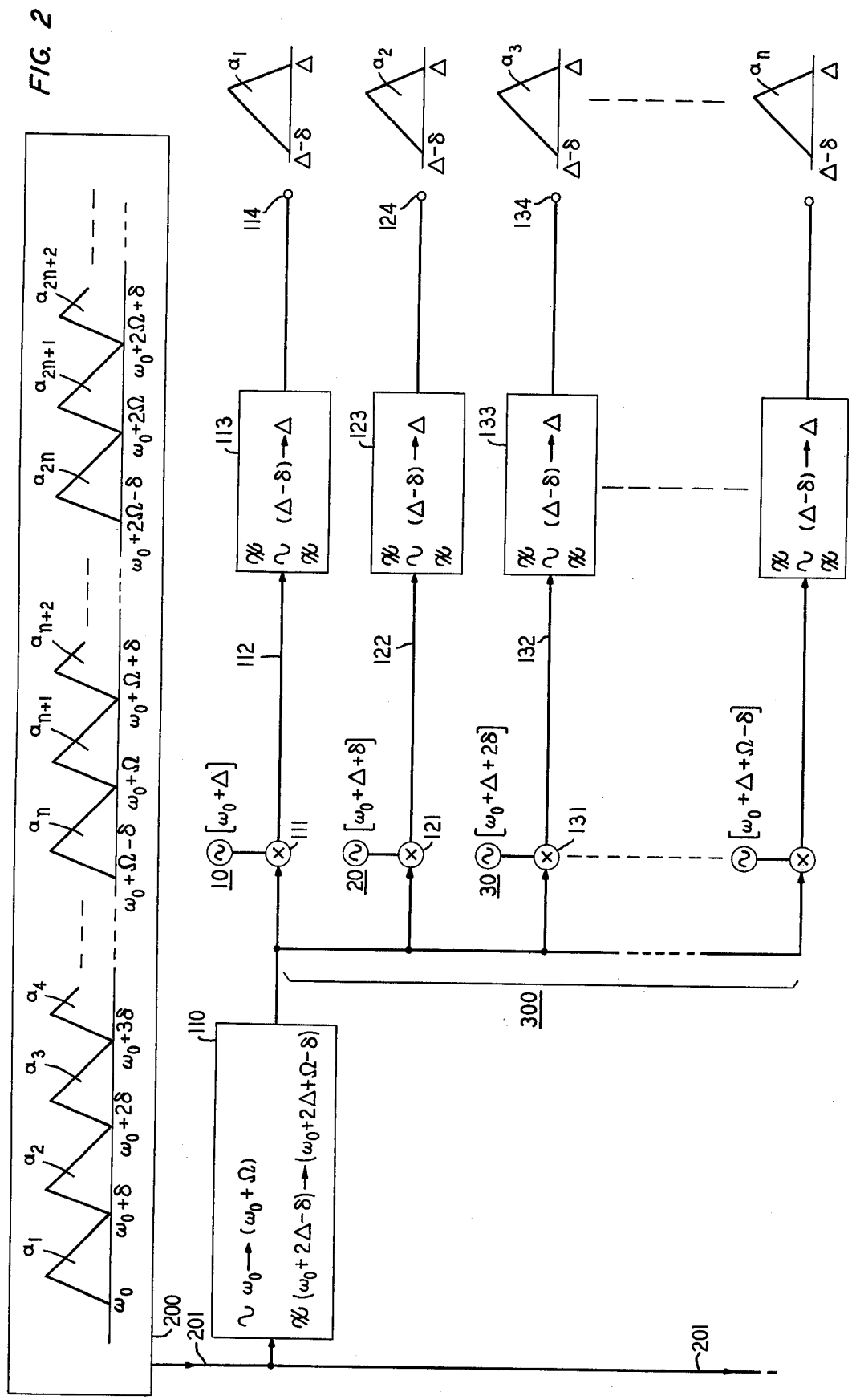
FIG. 2 is a diagram of a channel bank filter receiver apparatus incorporating the array of oscillators shown in FIG. 1.

FIG. 2 is a diagram of a portion of channel bank filter receiver using the array of oscillators 10, 20, 30 . . . , previously described in detail in connection with FIG. 1. Only for the purpose of clarity, in FIG. 2, only the first group 300 of $n$ filters for the first (lowest frequency) $n$ channels is illustrated in detail.

An input frequency division multiplexed signal source 200 contains many (single sideband) audio message channels; each channel having the same frequency width $\delta$ but different carrier frequencies, thereby yielding an input of multiplexed nonoverlapping frequency channels, $\omega_o$ to $(\omega_o + \delta), (\omega_o + \delta)$ to $(\omega_o + 2\delta), (\omega_o + 2\delta)$ to $(\omega_o + 3\delta) \ldots (\omega_o + \Omega - \delta)$ to $(\omega_o + \Omega), (\omega_o + \Omega)$ to $(\omega_o + \Omega + \delta) \ldots$; with amplitudes $a_1, a_2, a_3 \ldots a_n$, $a_{n+1} \ldots$, as known in the art. The slope of each message channel indicates sideband orientation with respect to audio message frequency; i.e., highest amplitude represents the highest audio frequency. Thus, it is the lower sideband which is present in the source 200 for all carriers. To each group of $n$ channel filters (of which only the first group of channel filters 300 is shown in FIG. 2) is fed the output of this multiplexed source 200 thorugh a different bandpass preselect filter. To the first (lowest frequency) such group of channel filters is thus fed the output of the source 200 through a preselect filter 110 that passes all signal frequencies in the band from $\omega_o$ to $(\omega_o + \Omega)$, i.e., the first "group" of channels ($a_1, a_2 \ldots a_n$), but eliminates signals of frequency in the undesired "image" producing band $(\omega_o + 2\Delta - \delta)$ to $(\omega_o + 2\Delta + \Omega - \delta)$ where $\Delta$ is the I.F. of the heterodyning process described more fully below.

Regarding the parameters of the preselect filter 110, defining $\omega_1 = \omega_o + \Delta$ (i.e., the lowest frequency of the oscillators in the first group of channel filters 300), then the low frequency edge of the elimination band of the preselect filter 110 is equal to: $\omega_o + 2\Delta - \delta = \omega_1 + \Delta - \delta$. And, defining $\omega_2 = \omega_o + \Delta + \Omega - \delta$ (i.e., the highest frequency of these oscillators in the group 300), then the high frequency edge of the elimination band of the preselect filter 110 is equal to: $\omega_o + 2\Delta + \Omega - \delta = \omega_2 + \Delta$.

Defining $n\delta = \Omega$, where advantageously $\delta$ is now also equal to the individual message channel frequency width or spread, then $\Omega$ is thus the frequency width or spread of a single group of $n$ channels. For example, $\Omega = 48$ kHz for $n = 12$ with $\delta = 4$ kHz; or $\Omega = 96$ kHz for $n = 24$, again with $\delta = 4$ kHz.

By way of continuing the foregoing example for purpose of illusttration only, the intermediate frequency $\Delta$ can be selected to be 62 KHz, while the lowest carrier frequency $\omega_o$ can be selected to be 338 KHz, so that $(\omega_o + \Delta)$ is equal to 400 KHz. With the first (lowest frequency) 24 of the 26 oscillators described above, a channel bank filter with one group of 24 message channels (or else two channel groups of 12 channels each) can thus be obtained in the configuration of FIG. 2 as more fully described below.

The output of the preselect filter 110 is fed to a first multiplier ("mixer") element 111 to which is also fed the purely sinusoidal output at frequency $(\omega_o + \Delta)$ of the oscillator 10 (previously described in conjunction with FIG. 1). As known in the art, such a mixer element 111 will then have an output 112 at the sum and difference frequencies of the inputs to the mixer, the oscillator 10 functioning as a "local" heterodyne oscillator. Specifically, the output 112 will contain frequencies in the ranges of $(\Delta - \Omega)$ to $\Delta$, and $(2\omega_o + \Delta)$ to $(2\omega_o + \Delta + \Omega)$. The latter range is known as an "image (sideband)". This output 112 is then fed to another bandpass filter 113 ("output BPF") which passes only those signals of frequencies in the range of $(\Delta - \delta)$ to $\Delta$, that is, signals due to $a_1$ only. Thus, $\Delta$ is the "intermediate frequency" (I.F.) in the heterodyning process thus undergone by the input frequencies from the source 200 in the range of $\omega_o$ to $(\omega_o + \Omega)$ by virtue of the mixing process in the mixer 111. Thereby, the bandpass filter 113 produces an output signal at output terminal 114 representative of solely the first message channel modulating the I.F. ($\Delta$) in single sideband fashion (with an inversion of message frequencies, as indicated by the reverse slope of the output $a_1$ at terminal 114 compared to the slope of the input $a_1$ in the signal source 200).

Similarly, as further indicated in FIG. 2, the outputs of the preselect filter 110 are also fed to a second mixer 121 to which the purely sinusoidal output at frequency $(\omega_o + \Delta + \delta)$ of the oscillator 20 is simultaneously fed. The mixer 121 thus has an output signal 122 containing frequencies in the ranges from $(2\omega_o + \Delta + \delta)$ to $(2\omega_o + \Delta + \Omega + \delta)$ and from $(\Delta + \delta)$ to $(\Delta - \Omega + \delta)$. Another BPF 123, which passes through only those signals of frequencies in the range of $(\Delta - \delta)$ to $\Delta$ (i.e., substantially identical to the BPF 113 preveiously described), receives this output signal 122. In response thereto, the BPF 123 delivers an output signal at output terminal 124 of amplitude proportional to $a_2$ and representative solely of the second message channel modulating the I.F. heterodyne frequency $\Delta$.

Similarly to the foregoing, yet another BPF 133, which is substantially identical to BPFs 113 and 123 previously described, receives an output 132 of yet another mixer 131 to which the outputs of the preselect filter 110 and the sinusoidal output of the "local" oscillator 30 (purely at $\omega_o + \Delta + 2\delta$) are applied. In response thereto, the BPF 133 produces an output signal at output terminal 134 of amplitude proportional to $a_3$, representative of the third message channel as a single sideband of the intermediate frequency $\Delta$. Similarly, the entire first message channel group ($a_1, a_2, a_3 \ldots a_n$) can be obtained as a separated (i.e., filtered) group of output signals, each modulating the intermediate frequency (I.F.).

The second frequency division multiplexed channel group ($a_{n+1}, a_{n+2} \ldots a_{2n}$) in the source 200 can similarly obtain as a filtered group by furter feeding the source 200 to another preselected bandpass filter (not shown) which eliminates the band ($\omega_o + 2\Delta + \Omega - \delta$) ($\omega_o + 2\Delta + 2\Omega - \delta$) lbut which passes the band ($\omega_o + \Omega$) to ($\omega_o + 2\Omega$) to an array of mixers (similar to the array of mixers 111, 121, 131, etc.). Each of these mixers is also fed the purely sinusoidal outputs of a different local oscillator of frequencies ($\omega_o + \Delta + \Omega$), ($\omega_o + \Delta + \Omega + \delta$), ($\omega_o + \Delta + \Omega + 2\delta$) $\ldots$ ($\omega_o + \Delta + 2\Omega - \delta$), respectively. The resulting output of each of these mixers is then fed to a different bandpass filter, each of which has the same passband ($\Delta - \delta$) to $\Delta$ (i.e., substantially identical to the BPFs 113, 123, 133, etc., as previously described). The outputs of these bandpass filters are the desired filtered channels of the second group.

Alternatively, in order to filter this second group of channels using the same local oscillators 10, 20, 30, etc., as used in filtering the first group of channels, the signal 201 from the source 200 is fed to an auxiliary mixer to which is applied output of an auxiliary "local" oscillator (which can be constructed similarly to the oscillator 10 except for the values of the parameters). This auxiliary "local" oscillator is designed to provide a purely sinusoidal output at frequency $\Omega$. The output of this mixer is then fed to a preselected filter (substantially identical to the preselect filter 110) passing the band $\omega_o$ to ($\omega_o + \Omega$) to an array of filters substantially identical to the first group of filters 300, that is, to "local" oscillators substantially identical to local oscillators 10, 20, 30 $\ldots$, and bandpass filters substantially identical to bandpass filters 113, 123, 133 $\ldots$, as previously described. Thereby, filtered heterodyned outputs of the second channel group ($a_{n+1}, a_{n+2}, \ldots a_{2n}$) will be obtained.

Similarly, all the remaining higher frequency channel groups can be filtered by heterodyning, and thus each of the component message channels can be delivered to a separate output terminal, as desired in a channel bank filter receiver.

It should be noted that any of the bandpass preselect filters eliminate and reject all signals of frequencies corresponding to undesired signals of the image sideband producing frequencies; that is, for example, the signals in channels of the source 200 of frequencies in the range of ($\omega_o + 2\Delta - \delta$) to ($\omega_o + 2\Delta + \Omega - \delta$) in the case of the first channel group, which would yield spurious signal outputs from the filters for the first group of $n$ channels. Similar considerations apply to the other channel groups. However, it is not crucial what the preselect filters' effects may be on other frequencies, that is, on frequencies not in the above elimination band of frequencies or in the passband of frequencies $\omega_o$ to ($\omega_o + \Omega$). Thus the requirements on the complexity and control over the design parameters of the preselect filters are all accordingly relatively relaxed.

Although the array of oscillators 10, 20, 30, etc., has been described in FIG. 2 in conjunction with the process of demultiplexing in a channel bank filter receiver; nevertheless, this array of oscillators is also useful in conjunction with the opposite process of multiplexing in a channel bank filter transmitter (for sending frequency division multiplexed information over a single transmission line). More specifically, in the case of the sending bank, each of the individual message channel inputs is separately mixed with an I.F. local oscillator, and then each of the outputs of the mxing process is passed through a different single sideband pass filter (each with different passbands) in order to remove the unwanted upper sideband of each message channel prior to mixing each channel with a different frequency of the oscillator array of this invention and then bringing together onto a single transmission line the resulting signals on different carrier frequencies, as known in the art. See, for example: *Transmission System for Communication*, 4th Edition, pp. 131-135. (Bell Telephone Laboratories, 1970.)

Figure 3:
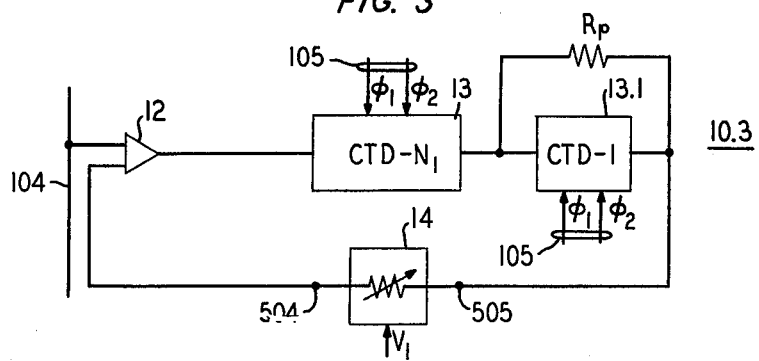
FIG. 3 is a circuit diagram of a recursive oscillator useful in the array shown in FIG. 1, in accordance with another specific embodiment of the invention.
Figure 4:
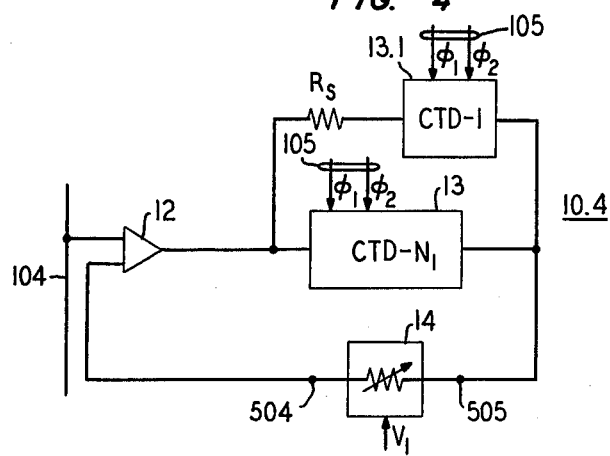
FIG. 4 is a circuit diagram of a recursive oscillator useful in the array shown in FIG. 1, in accordance with yet another specific embodiment of the invention.

As alternatives to the RC elements as incremental time delays in the oscillators 10, 20, 30, etc., the circuit arrangements illustrated in FIG. 3 or FIG. 4 can be used. As shown in FIG. 3, an oscillator 10.3 is arranged to oscillate at the same frequency as the oscillator 10 previously described. The only difference is that an incremental time delay in the feedback path of the oscillator 10.3 is provided by placing in series with the CTD 13 (of $N_1$ stages) the combination of a resistor $R_p$ in parallel with an auxiliary single-stage ($N=1$) CTD 13.1. Advantageously, this one-stage CTD 13.1 is driven by the same two-phase ($\Phi_1\Phi_2$) clock pulse train 105 as the $N_1$-stage CTD 13. In this way, the same incremental time delay in the feedback path of oscillator 10.3 can be obtained as that produced by the $R_1C_1$ incremental time delay element in the feedback path of the oscillator 10.

FIG. 4 shows another alternative arrangement for obtaining the desired incremental time delay in the feedback path. In this case, the feedback path contains the combination of the auxiliary one-stage CTD 13.1 in series with a resistor $R_s$, all in parallel with the $N_1$-stage CTD 13.

FIG. 5 shows an illustrative example of one type of variolosser element 500 having terminals 504 and 505, which is suitable for use in the feedback path of any of the recursive oscillators 10, 10.3, 10.4, 20, 30, etc. A P-channel insulated gate field effect transistor (IGFET) 501 has a source terminal 506, and a drain terminal in common with the variolosser terminal 504. The gate terminal of this IGFET is ohmically connected to the output terminal of a difference amplifier 502. One of the input terminals of this amplifier is connected to an external control voltage source $V_b$, which provides an adjustable input voltage in accordance with the ultimately desired loss in the variolosser. The other of the input terminals of the amplifier 502 is connected to a terminal of a unidirectional diode 503 which passes current in only the indicated one sense of direction and serves as a diode detector (in conjunction with an RC smoothing filter 507 and 508) of the voltage at the variolosser terminal 505. This terminal 505 of the variolosser is ohmically connected to the source terminal 506 of the IGFET 501.

During operation, the diode 503 serves to detect the (peak or, depending on design, average) value of the AC amplitude (in a positive sense as per diode direction) at terminal 505; and thereby the diode 503 feeds a unidirecional voltage signal to the amplifier 502 which is proportional to this AC amplitude. Thereby, the amplifier feeds a signal to the gate of the IGFET 501 which is proportional tothe difference in voltages between the foregoing DC voltage signal of the diode 503 and the control voltage $V_i$. The impedance from source to drain terminals of the IGFETs will then be responsive to this difference in voltages. More particularly, the control voltage $V_i$ can be adjusted so that when the AC amplitude at terminal 505 is relatively low, then the IGFET 501 presents a relatively low impedance (low loss) between drain and source terminals 504 and 506; but when the AC amplitude at terminal 505 is relatively high, then the IGFET 501 presents a relatively high impedance (high loss) between terminals 504 and 506. Thus, the variolosser 500 presents just the type of impedance characteristic between its terminals 504 and 505 that is desirable in the recursive oscillators 10, 10.3, 10.4, etc.

Accordingly, the variolosser element 500 (when placed in the circuit of FIGS. 1, 3 or 4) serves to increase the impedance, and hence increase the loss, as the (AC) oscillation amplitude reaches a certain value determined (at least in part) by $V_i$. Thereby, the amplitude of oscillations established in each of the oscillators 10, 20, 30, etc. (or 10.3, 10.4, etc.), can be stabilized at a predetermined amplitude level.

It should be understood, of course, that an N-channel IGFET can be used instead of the P-channel IGFET 501, with suitable rearrangement of the polarities of the other elements of the variolosser 500.

It should also be understood that the array of oscillators shown in FIG. 1 can be integrated in a single semiconductor substrate chip in accordance with conventional silicon integrated circuit technology, except for the master clock 100. Likewise, the entire channel bank filter receiver shown in FIG. 2 can likewise be integrated in a single semiconductor chip.

Although the invention has been described in detail with reference to specific embodiments, it should be understood that various modifications can be made without departing from the scope of the invention. For example, although the locking signal 103 has been described as a sequence of narrow pulses, various other types of locking signals can be used such as signals which are spectrally equivalent to the above-described locking signal over all the capture ranges. For example, passing the pulses of the above-described locking signal through a complex all-pass network (which introduces phase dispersion but does not change any amplitudes) will produce a different but suitable locking signal which differs from the original locking signal only in phase content but not amplitude content at every frequency.

In addition, the locking signal need only be specified in the frequency capture ranges of the various oscillators, since the content of the locking signal outside these capture ranges is immaterial. Thus, for example, noise or other signals in the locking signal at frequencies outside the capture ranges do not render such a locking signal unusable.

Moreover, the master clock can be generalized. For example, an order master clock of one frequency can have its output processed by such techniques as mixing it with a signal of another frequency and putting the result through a Weaver modulator; and even if the output of the Weaver modulator is somewhat impure as to sidebands (due to imbalances in such a modulator), nevertheless this output is still usable as the master clock signal source 100 in this invention simply because the system is not responsive to such signal impurity, the average number of passes through zero per unit time of such an impure signal being unaffected by this type of signal impurity.

What is claimed is:

1. Semiconductor apparatus which comprises an array of a first plurality of electrical oscillators, each oscillator including different semiconductor charge transfer device delay lines; an input terminal of said transfer device being connected to an output terminal of a separate amplifier having first and second input terminals and an output terminal of said transfer device being connected to a separate one of said feedback paths, each path going from said output terminal of the corresponding charge transfer device to the second input terminal of the amplifier; a second plurality, that is equal to or smaller than said first plurality but is greater than one-half of the first plurality, of said feedback paths including a spearate variolosser element connected in series with a separate incremental time delay element for producing an incremental time delay in the feedback path which is less than that of the corresponding charge transfer device; whereby electrical oscillations having a predetermined different sinusoidal frequency in each oscillator can be generated in response to a locking signal delivered to said first input terminal of each of said amplifiers; and further including a different output terminal means in each of said oscillators for delivering an output signal of the corresponding oscillator in accordance with the corresponding said predetermined frequency.

2. Apparatus according to claim 1 in which the incremental time delay is less than that of a single stage of the corresponding charge transfer device, the number of stages in said transfer device being larger than 10.

3. Apparatus according to claim 2 in which the variolosser is adjusted such taht the overall loop gain of each oscillator differs from unity by about 0.01 or less.

4. Apparatus according to claim 3 in which said amount is of the order of 0.0001.

5. Apparatus according to claim 3 in whkich all the charge transfer devices are driven by a single clock pulse train whose timing is controlled by a master clock, and in which the first input terminal of all the amplifiers is connected to a single locking signal line for delivering said locking signal to said first input terminal of every one of said amplifiers.

6. Apparatus according to claim 5 in which the locking signal line is connected to a source of said locking signal, said source controlled by said master clock so that the locking signal is phase coherent with said master clock.

7. Apparatus according to claim 2 in which all the charge transfer devices are driven by clock pulses whose timing is controlled by a master clock and in which the first input terminal of all the amplifiers is connected to a single locking signal line for delivering said locking signal to said first input terminal of every one of said amplifiers.

8. Apparatus according to claim 7 in which the first input terminals of the amplifiers are all connected together to a single locking signal line for deliverying said locking signal to siad first input terminal of every one of said amplifiers.

9. Apparatus according to claim 1 in which all the charge transfer devices are driven by clock pulses whose timing is controlled by a master clock and in which the first input terminal of all the amplifiers is connected to a single locking signal line for delivering said locking signal to said first input terminal of every one of said amplifiers.

10. Apparatus according to claim 9 in which the first input terminals of all the amplifiers are connected together to a single locking signal line for delivering said locking signal to said first input terminal of every one of said amplifiers.

11. Semiconductor apparatus which comprises:
a. the array of oscillators recited in claim 1;
b. a plurality, equal to the first plurality, of signal mixer elements, each of said mixer elements having first and second input terminals of which the first of said terminals is connected to the output terminal means of a different one of said oscillators and of which the second of said terminals is connected to a common terminal means for delivering a frequency division multiplexed signal; and
c. a pluraltiy, equal to the first plurality, of substantially identical bandpass filters each characterized by a passband of the same frequency width $\delta$, each of said bandpass filters having an input terminal connected to an output terminal of a different one of said mixer elements.

12. Apparatus according to claim 11 which further includes a preselect filter for eliminating the band of frequencies extending from $(\omega_1 + \Delta - \delta)$ to $(\omega_2 + \Delta)$, where $\omega_1$ is the predetermined frequency of lowest value in the array of the oscillators, and where $\omega_2$ is the predetermined frequency of highest value in the array of the oscillators.

13. Semiconductor apparatus comprising:

a. an array of semiconductor charge transfer delay line devices integrated in a single semiconductor substrate;
b. an array of incremental time delay elements, each of said elements in series with a different one of said transfer devices, thereby forming an array of composite delay lines each of which consists essentially of one of said charge transfer delay line devices in series with the corresponding one of said incremental time delay elements;
c. an array of feedback means, each for feeding back electrical signals to a different one of said composite delay lines after each of said signals has undergone a different delay through the corresponding said composite delay line, thereby forming an array of feedback loop recursive devices; the delays of said charge transfer devices and said incremental elements being such that, in response to a single locking signal delivered to all of said recursive devices, an electrical sinusoidal oscillation is established in each recursive device which is of a different predetermined frequency in each of said recursive devices from that established in all of the other recursive devices.

14. Apparatus according to claim 13 in which each of said feedback means includes a different amplifier each having a first input terminal for the application of the locking signal and a second terminal for the application of said electrical signals after having undergone the said delay through the said composite delay line.

15. Apparatus according to claim 14 in which each of said feedback means includes a different variolosser for increasing the loss when the amplitude of said oscillation reaches a predetermined amplitude value, in order to stabilize the amplitude of the oscillation at the predetermined amplitude value.

16. Apparatus according to claim 13 in which the delay of each incremental device is less than the delay of a single stage of the corresponding charge transfer device with which it is in series.

* * * * *